United States Patent [19]
Freeman et al.

[11] Patent Number: 5,914,527
[45] Date of Patent: Jun. 22, 1999

[54] SEMICONDUCTOR DEVICE

[75] Inventors: John J. Freeman, Scottsdale; Arlene Bennett, Gilbert; O. Melville Clark, Tempe, all of Ariz.

[73] Assignee: Microsemi Corporation, Santa Ana, Calif.

[21] Appl. No.: 09/040,204

[22] Filed: Mar. 13, 1998

[51] Int. Cl.$^6$ .................................................. H01L 29/47
[52] U.S. Cl. .................. 257/623; 257/621; 257/773; 257/774
[58] Field of Search .................. 257/88, 99, 459, 257/461, 653, 773, 774, 621, 623–626, 594, 618, 698, 699, 780; 438/39, 40, 578, 667

[56] References Cited

U.S. PATENT DOCUMENTS 5,357,123 10/1994 Sugawara ..................................... 257/92

FOREIGN PATENT DOCUMENTS 35-3018387 6/1978 Japan ........................................ 257/621

*Primary Examiner*—Minh Loan Tran
*Assistant Examiner*—Hung K. Vu
*Attorney, Agent, or Firm*—Michael A. Sileo, Jr.; Gary C. Honeycutt

[57] ABSTRACT

The present invention is directed to a semiconductor device and method wherein a vertical opening is provided or formed completely through a semiconductor substrate of the semiconductor device to print an external electrical contact to be made to one of the semiconductor regions of the semiconductor substrate. In the disclosed embodiment an electrical contact is also provided to the bottom portion of the semiconductor substrate.

10 Claims, 3 Drawing Sheets

SEMICONDUCTOR DEVICE

FIELD OF THE INVENTION

This invention relates generally to semiconductor devices and methods therefor and, more particularly, to an improved semiconductor device and method of producing such an improved semiconductor device wherein a vertical opening through a semiconductor substrate permits positioning therein a metal conductor shaped as a metal pin to permit an external electrical contact to be made to one of the semiconductor regions of the semiconductor substrate while still being located within the area defined by the exterior boundary of the semiconductor substrate.

BACKGROUND OF THE PRIOR ART

In the past, various types of electrical connections have been provided to different types of semiconductor devices. Electrical connections have been provided to top and bottom portions of semiconductor chips which comprise semiconductor substrates having one or more regions of opposite type conductivity (i.e. P or N). Electrical connections to the top surface portion of one region of a semiconductor substrate usually extend in a substantially horizontal direction above the semiconductor substrate before a portion of the electrical connection extends vertically into electrical contact with an exposed region of the semiconductor substrate. Such a prior art type of top electrical connections is undesirable because transient voltages provided by the top (P or N) regions of the semiconductor substrate can affect the substantially horizontal top electrical connection.

Therefore, a need existed to provide an improved electrical connection by means of an opening or hole through preferably the center portion of a transient voltage suppressor chip or substrate to permit thru-hole mounting of a metal pin for electrical connection to a top region (P or N) of the chip or substrate.

SUMMARY OF THE INVENTION

It is an object of this invention to provide an improved semiconductor device and method of providing the improved semiconductor device.

It is another object of this invention to provide an improved semiconductor device and method of providing the improved semiconductor device wherein a vertical opening is provided in the device to permit electrical connection to be made by means of a metal pin located in the opening to a region (P or N) located in a top portion of the semiconductor device.

It is a further object of this invention to provide an improved semiconductor device and method of providing the improved semiconductor device wherein a plurality of vertical openings are provided in the device to permit electrical connections to be made by means of a separate metal pin located in each of the plurality of vertical openings which are each used to provide an electrical connection to a respective region (P or N) located in a top portion of the semiconductor device.

BRIEF DESCRIPTION OF THE PREFERRED EMBODIMENTS

In accordance with one embodiment of the invention, a semiconductor device is provided comprising, in combination: a semiconductor substrate having a first region of one conductivity type and a second region of opposite conductivity type, the semiconductor substrate having at least one opening passing vertically through the semiconductor substrate; and a vertical metal conductor located in the opening and extending above a top surface of the semiconductor substrate, the vertical metal conductor having means for providing electrical contact to one of the first and second regions.

In accordance with another embodiment of this invention, a method of providing a semiconductor device is disclosed comprising the steps of: providing a semiconductor substrate having a first region of one conductivity type and a second region of opposite conductivity type, the semiconductor substrate having at least one opening passing vertically through the semiconductor substrate; and providing a vertical metal conductor located in the opening and extending above a top surface of the semiconductor substrate, the vertical metal conductor having means for providing electrical contact to one of the first and second regions.

The foregoing and other objects, features and advantages of this invention will be apparent from the following more particular description of the preferred embodiments of the invention as illustrated in the accompanying drawings.

DESCRIPTION OF THE SPECIFICATION

Figure 1:
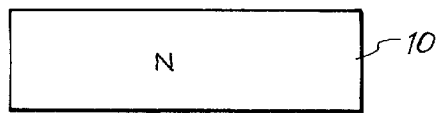
FIG. 1 is an enlarged side elevational view of a portion of a semiconductor substrate used in providing the semiconductor device of this invention.

Referring to FIG. 1, a semiconductor substrate 10 is shown which is, for example, a silicon semiconductor substrate of N type conductivity. If desired, the starting semiconductor substrate can be made of P type material and the other regions or conductivities depicted in the following Figures will be opposite to the conductivities that are shown in these Figures.

Figure 2:
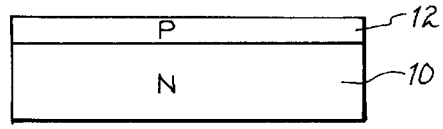
FIG. 2 is view similar to the view of FIG. 1 wherein a region of opposite type conductivity (i.e. P) is shown formed above a region of one conductivity (i.e. N) type.

Referring to FIG. 2, a region 12 of P type conductivity is formed or deposited on the starting N type semiconductor substrate 10. The P type region 12 can be formed by various techniques such as by diffusion or ion implantation of a P type impurity into a top surface portion of the starting N type semiconductor substrate. N type impurities that can be used for the N type substrate 10 can be Phosphorous, Arsenic, etc. A P type impurity that can be used for the P type region can be Boron, etc. If desired, the P type region 12 can be formed by epitaxially growing a P type region on the starting N type semiconductor substrate 10.

Figure 3:
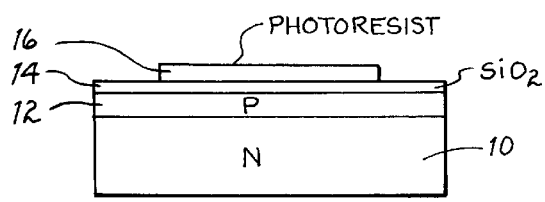
FIG. 3 is a view similar to the view of FIG. 2 wherein a surface insulating layer is shown formed or deposited on the top surface of the region of opposite type conductivity and also a smaller photoresist layer is shown deposited or formed on a top surface substantially center portion of the insulating layer.

Referring to FIG. 3, an insulating layer 14 of preferably Silicon Dioxide (SiO$_2$) is deposited or, if desired, thermally grown on the top surface of the P type region 12. Subsequently, a layer of photoresist 16 is deposited or formed on the top surface of the Silicon Dioxide insulating layer 14. This can be achieved using masking and etching techniques to form the photoresist layer 16 which is, as can be seen with reference to FIG. 3, smaller in length and preferably substantially centered over the Silicon Dioxide layer 14.

Figure 4:
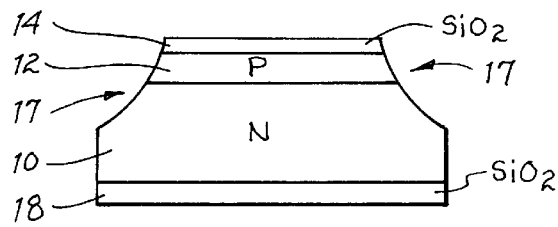
FIG. 4 is a view similar to the view of FIG. 3 showing the formation of a tapered top side semiconductor substrate edge portion and the formation of an insulating layer on a bottom surface of the semiconductor substrate.

With reference to FIG. 4, this Figure illustrates the resulting configuration after an etching operation of the structure of FIG. 3 wherein the photoresist layer 16 of FIG. 3 (not shown in FIG. 4) is used as a mask to permit the formation of a somewhat concave surface portion 17 in the top side portion of the P region 12 and the top side surface portion of the N type semiconductor substrate 10. Following this etching operation to form the concave surface portion 17 as shown in FIG. 4, a Silicon Dioxide layer 18 is formed or deposited on the back or bottom surface portion of the N type semiconductor substrate 10.

Figure 5:
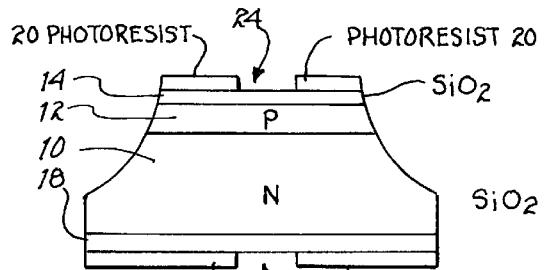
FIG. 5 is a view similar to the view of FIG. 4 after the deposition and patterning of a layer of photoresist on the top and bottom surfaces of the insulating layers respectively covering the top and bottom surfaces of the semiconductor substrate to provide substantially center openings in the top and bottom layers of photoresist.

Referring to FIG. 5, top 20 and bottom 22 patterned photoresist layers are formed respectively on the top and bottom surface portions of the structure of FIG. 4. The photoresist layers 20 and 22 are etched using masking and etching techniques to respectively create substantially centered openings 24 and 26 which are not only centered with respect to the top and bottom surface portions of the structure of FIG. 4, but these openings 24 and 26 are also substantially in alignment with each other.

Figure 6:
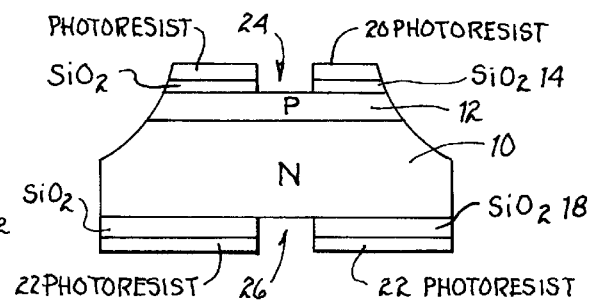
FIG. 6 is a view similar to the view of FIG. 5 after openings are formed in the top and bottom insulating layers using the associated photoresist layers as a mask.

Referring to FIG. 6, this Figure shows the structure of FIG. 5 after another etching step wherein the opening 24 now extends through the Silicon Dioxide layer 14 and the opening 26 now extends through the Silicon Dioxide layer 18. This etching step, as described with reference to FIG. 5, is preferably carried out to simultaneously form the extended openings 24 and 26.

Figure 7:
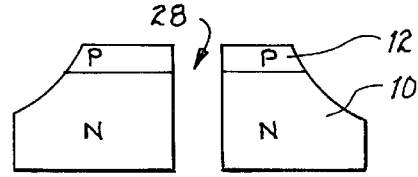
FIG. 7 is a view similar to the view of FIG. 6 after a vertical opening is formed substantially in the center of the semiconductor substrate or chip and after the removal of the top and bottom photoresist layers and the associated top and bottom insulating layers.

Referring to FIG. 7, the structure depicted in FIG. 7 is the resulting structure that is achieved after further etching operations wherein a center hole or opening 28 is created completely through the entire P type region 12 and the underlying N type semiconductor substrate 10. In creating the structure of FIG. 7, the photoresist layers 20 and 22 and the Silicon Dioxide layers 14 and 18 shown in FIG. 6 are removed preferably by chemical etching techniques.

Figure 8:
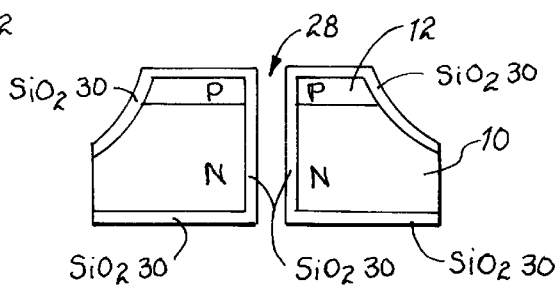
FIG. 8 is a view similar to the view of FIG. 7 after the formation of an insulating layer in the substantially center opening and also on top and bottom surface portions of the semiconductor substrate.

Referring to FIG. 8, a Silicon Dioxide layer 30 is preferably deposited or thermally grown on selected top, bottom and side portions of the structure of FIG. 7 as shown in FIG. 8. As can be seen with reference to FIG. 8, the center hole or opening 28 is now somewhat narrowed in diameter because of the substantially cylindrical shaped Silicon Dioxide layer 30 that is located within the opening 28.

Figure 9:
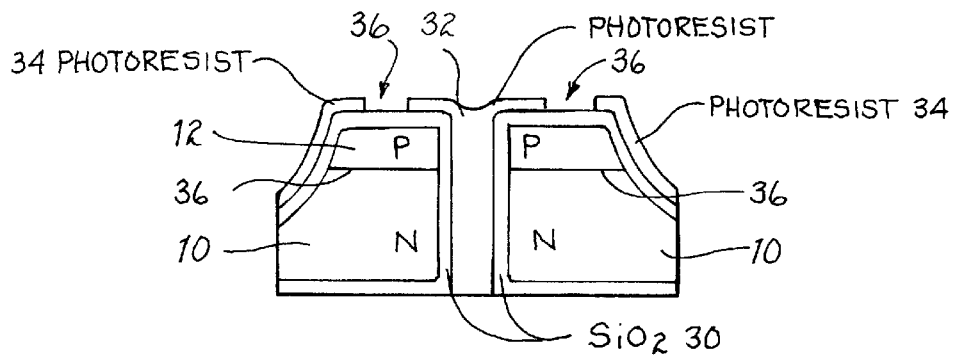
FIG. 9 is a view similar to the view of FIG. 8 after the deposition and formation of a patterned photoresist material in the substantially center opening and on selected portions of substantially the top surface of the insulation layer covering the top portion of the semiconductor substrate.

Referring to FIG. 9, this structure of FIG. 9 is the resulting structure that is achieved after the deposition and patterning of photoresist on the structure of FIG. 8. Thus, a center photoresist portion 32 and photoresist portion 34 that covers PN Junction 36 at the external location thereof as well as the portions of the P type region 12 and the N type semiconductor substrate 10 that form the somewhat concave region (see reference number 17 of FIG. 4) are created or formed. As can be seen with reference to FIG. 9, an opening 36 is created between the photoresist regions 32 and 34 to permit the formation in the opening 36 of a metallized layer portion as described below with reference to FIG. 10.

Figure 10:
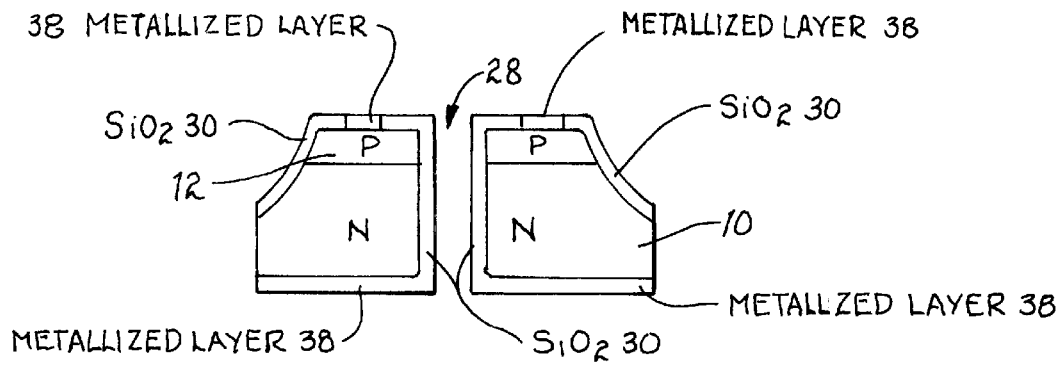
FIG. 10 is a view similar to the view of FIG. 9 after the removal of the exposed insulating layer portions at the bottom and top surface portions of the semiconductor substrate and after the deposition of a metallized layer on the semiconductor surface portions that are exposed after removal of the exposed insulating layer portions.

Referring to FIG. 10, this structure of FIG. 10 depicts the resulting structure that is achieved after the etching away of the Silicon Dioxide portions that are exposed by the openings in the photoresist regions 32 and 34 after the deposition of a metallized layer 38 into the hole or opening 36 of the structure of FIG. 9. As can be seen with reference to FIG. 10, a metallized layer 38 is also formed at the bottom portion of the structure. The purpose of the metallized layer portion 38 at the top surface portion of the P type region 12 and the metallized layer portion 38 at the bottom portion of the structure of FIG. 10 is described below. As can also be seen with reference to FIG. 10, the center opening 28 (see FIG. 8 also) has been opened up or cleared because of the removal by etching techniques of the center photoresist portion 32 (see FIG. 9).

Figure 11:
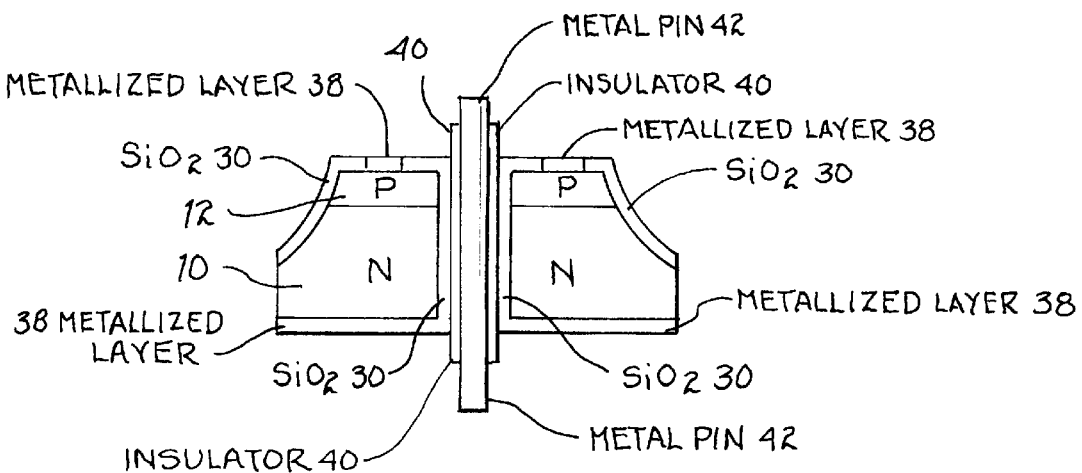
FIG. 11 is a view similar to the view of FIG. 10 after the formation of a cylindrical shaped insulator in the substantially center opening of the semiconductor substrate and after the insertion of a metal pin within the cylindrical shaped insulator.

Referring to FIG. 11, the structure depicted in FIG. 11 is the resulting structure that is obtained from the structure of FIG. 10 after the insertion or formation therein of an insulator (preferably cylindrical in shape) 40 that is located within the center opening 28 (see FIG. 10) and inside of the Silicon Dioxide central insulation portion 30 (that is also preferably cylindrical in shape). The purpose for this insulator 40 is described below. Following the insertion or formation of the central insulator 40, a metal pin 42 is inserted within the center opening 28 (see FIG. 10) and inside the opening formed within the cylindrical insulator 40. The metal pin 42 functions as a metal conductor and, while the metal pin 42 is shown as being solid, it is possible that a metallized coating can be deposited or formed within the center opening 28 (see FIG. 10) of the hollow insulator 40. This would leave a center opening for cooling purposes, if desired.

Figure 12:
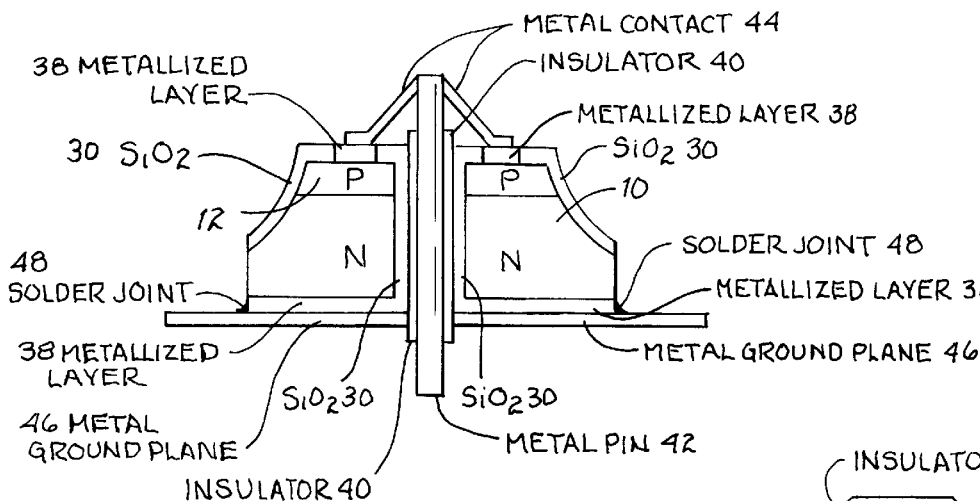
FIG. 12 is a view similar to the view of FIG. 11 after the formation of a metal contact from a top portion of the pin to a metallized larger portion in contact with the region of opposite type conductivity and after the formation of a metal ground plane in electrical contact with the region of one conductivity type through the bottom metallized layer.

Referring to FIG. 12, this is the final structure for the semiconductor device of this invention. The structure of FIG. 12 includes all of the elements of the structure of FIG. 11 plus metal contact 44 which provides electrical contact between the top portion of the metal pin 42 and the metallized layer 38 that is in electrical contact with the P type region 12 of the semiconductor (diode) device of FIG. 12 which includes the N type semiconductor substrate region 10. Also added to the structure of FIG. 11 is a metal ground plane 46 which is located at the bottom portion of the structure shown in FIG. 12. The metal ground plane is preferably attached to the bottom metallized layer 38 by means of a solder joint 48. Thus, electrical contact between the N type region 10 and the outside electrical connection (not shown) to the N type region 10 of the semiconductor (diode) device of FIG. 12 is achieved using the bottom metallized layer 38 and the connected metal ground plane 46. The cylindrical shaped insulator member 40 functions to electrically insulate, isolate or separate the electrical contacts to the N type region 10 (namely the metallized layer 38 and the underlying connecting metal ground plate 46).

Figure 13:
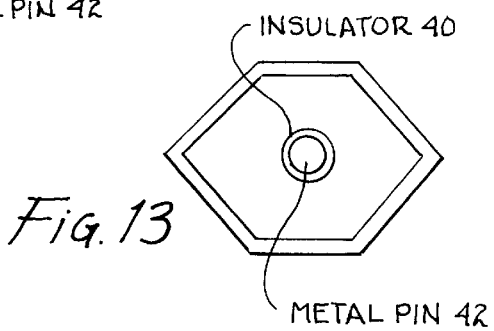
FIG. 13 is a top view of a hexagonal shaped semiconductor device in accordance with this invention thereby depicting one embodiment or configuration of the semiconductor device of FIG. 12.

Referring to FIG. 13, this Figure is a top view of a preferred embodiment of the semiconductor device of FIG. 12 wherein a hexagonal shaped configuration is depicted. Other configurations can be used, if desired, such as square, rectangle, etc. The semiconductor device of FIG. 12 which is depicted in, for example, a hexagonal configuration as shown in FIG. 13 which provides a hole or opening through the center of a transient voltage suppressor chip for thru-hole mounting. This thru-hole mounting is advantageous for transient protection of the connector pins 42. The connector pin 42 passes through the center hole and contact is made to the P region 12 on one side of the PN junction 36 (see FIG. 9) while the ground plane 46 contacts (through the metallized layer 38) the opposite side of the PN junction 36 thereby forming an optimum configured semiconductor device or package as shown.

Figure 14:
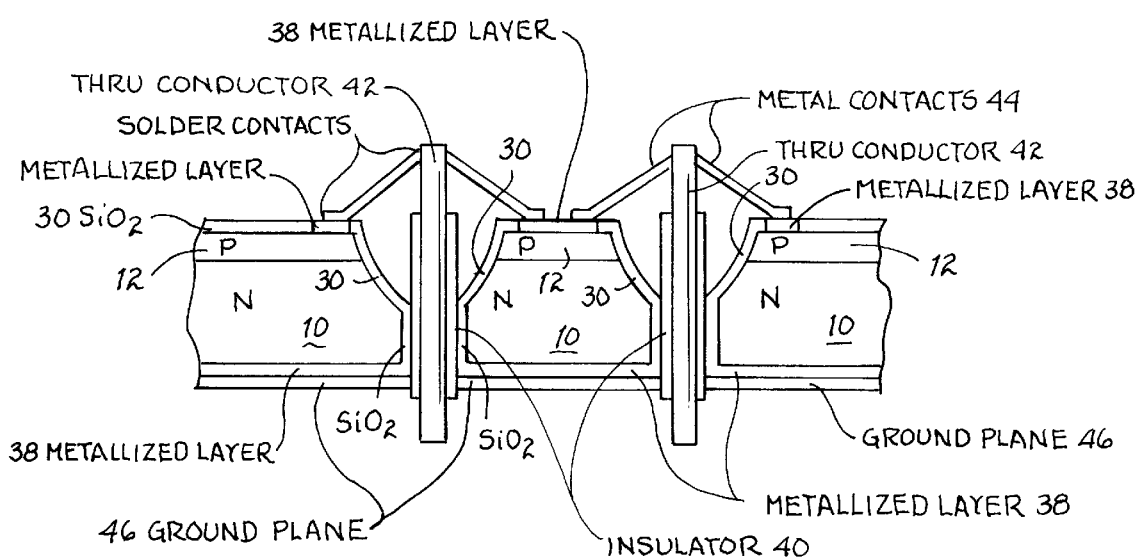
FIG. 14 is a side elevational view similar to the view of FIG. 12 depicting a semiconductor substrate having a plurality of vertical openings therein and a plurality of metal pins (one for each opening).

Referring to FIG. 14, this Figure illustrates an embodiment wherein a plurality of metal pins or thru conductors 42 are used (in this view two are shown). The other portions of FIG. 14 are similar to the elements shown and described with reference to FIG. 12. In this manner, more electrical power can be applied to and/or extracted from the semiconductor (diode) device of FIG. 14 as contrasted to the single metal pin 42 semiconductor device configuration of FIG. 12.

Various semiconductor chip sizes can be used according to surge current or surge power requirements in any particular type of use or application. Power and current capability at a given pulse width are directly proportional to the cross-section area of the PN junction. The following are suggested pulse power levels for the hexagonal configuration of FIG. 13: (a) 0.050 inches across points —85 W for 10/1000 $\mu$s; (b) 0.088 inches across points—450 W for 10/1000 $\mu$s; (c) 0.129 inches across points—825 W for 10/1000 $\mu$s; (d) 0.143 inches across points—1325 W for 10/1000 $\mu$s. The pulse power is based on inherent power rating of 0.140 watts/mil$^2$ for a pulse waveform of 10 $\mu$s rise, 1000 $\mu$s decay to ½ value. The metal pin 42 can have various size diameter such as (1) 0.0065 inches, (2) 0.010 inches, (3) 0.030 inches and (4) 0.040 inches, respectively. The following advantages are provided by the thruhole transient voltage suppressor chip or device disclosed herein: (A) the device can be used with connector plugs or sockets (B) there is no parasitic lead (terminal) inductance, (C) the device configuration allows for high density packaging and (D) the chip or device can be provided in both Bi-Directional and Uni-Directional polarities.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A semiconductor device comprising, in combination:
   a semiconductor substrate having a first region of one conductivity type and a second region of opposite conductivity type, said semiconductor substrate having at least one opening passing vertically through said semiconductor substrate; and
   a vertical metal conductor located in said opening and extending above a top surface of said semiconductor substrate, said vertical metal conductor having means for providing electrical contact to one of said first and second regions.

2. The semiconductor device of claim 1 wherein said vertical metal conductor is a solid metal conductor having a pin shaped configuration.

3. The semiconductor device of claim 1 including an insulator member located between said vertical metal conductor and an interior portion of said semiconductor substrate defining said opening and surrounding said vertical metal conductor.

4. The semiconductor device of claim 2 including a cylindrically shaped insulator member surrounding a portion of said solid metal conductor and located between said solid metal conductor and an interior portion of said semiconductor substrate defining said opening.

5. The semiconductor device of claim 1 wherein said semiconductor substrate having a P type region as said first region of one conductivity type and an N type region as said second region of opposite conductivity type.

6. The semiconductor device of claim 5 wherein said P type region being in electrical contact with said vertical metal conductor.

7. The semiconductor device of claim 6 wherein said N type region being below said P type region, and metal contact means located below and in contact with said N type region and insulated from said vertical metal conductor for providing electrical contact to said N type region.

8. The semiconductor device of claim 1 wherein metal contact means are located below and in contact with the other of said first and second regions and insulated from said vertical metal conductor for providing electrical contact to said other of said first and second regions.

9. The semiconductor device of claim 1 wherein said vertical metal conductor is a solid metal conductor having a pin shaped configuration, including a cylindrically shaped insulator member surrounding a portion of said solid metal conductor and located between said solid metal conductor and an interior portion of said semiconductor substrate defining said opening, said semiconductor substrate having a P type region as said first region of one conductivity type and an N type region as said second region of opposite conductivity type, said P type region being in electrical contact with said vertical metal conductor, said N type region being below said P type region, and metal contact means located below and in contact with said N type region and insulated from said vertical metal conductor for providing electrical contact to said N type region, said semiconductor substrate having a tapered top edge portion provided by said P type region having a tapered top edge portion and said N type region having a corresponding tapered top edge portion which together provide a tapered PN junction, and a passivation insulation layer covering said tapered PN junction.

10. The semiconductor device of claim 1 wherein a plurality of openings are provided passing vertically through said semiconductor substrate and a corresponding plurality of vertical metal conductors are provided with each one of said plurality of vertical metal conductors respectively located in a corresponding opening of said plurality of openings, each of said vertical metal conductors is a solid metal conductor having a pin shaped configuration.

* * * * *